United States Patent
Hwang

(10) Patent No.: US 9,263,492 B2
(45) Date of Patent: Feb. 16, 2016

(54) IMAGE SENSOR PACKAGE

(71) Applicant: Samsung Electronics Co., Ltd., Suwon-Si, Gyeonggi-Do (KR)

(72) Inventor: Hee-Jung Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/098,858

(22) Filed: Dec. 6, 2013

(65) Prior Publication Data
US 2014/0159185 A1 Jun. 12, 2014

(30) Foreign Application Priority Data
Dec. 6, 2012 (KR) .................. 10-2012-0140800

(51) Int. Cl.
*G01D 11/24* (2006.01)
*H01L 27/146* (2006.01)

(52) U.S. Cl.
CPC .... *H01L 27/14643* (2013.01); *H01L 27/14618* (2013.01); *H01L 2224/05554* (2013.01); *H01L 2224/45139* (2013.01); *H01L 2224/45144* (2013.01); *H01L 2224/48091* (2013.01); *H01L 2224/49175* (2013.01)

(58) Field of Classification Search
CPC .......................... G01D 11/24; G01P 15/0802
See application file for complete search history.

(56) References Cited

U.S. PATENT DOCUMENTS

| | | | |
|---|---|---|---|
| 2006/0186315 A1* | 8/2006 | Lee et al. | 250/208.1 |
| 2008/0136012 A1 | 6/2008 | Yang et al. | |
| 2008/0246845 A1 | 10/2008 | Chan | |
| 2008/0252775 A1* | 10/2008 | Ryu et al. | 348/374 |
| 2009/0223937 A1* | 9/2009 | Wang et al. | 219/85.13 |
| 2010/0201863 A1 | 8/2010 | Lin | |
| 2011/0024610 A1 | 2/2011 | Tu et al. | |

FOREIGN PATENT DOCUMENTS

| | | |
|---|---|---|
| JP | 2008-211378 A | 9/2008 |
| JP | 2010-205780 A | 9/2010 |
| JP | 2010-278603 A | 12/2010 |
| JP | 2011-198863 A | 10/2011 |
| JP | 2012-049377 A | 3/2012 |

* cited by examiner

*Primary Examiner* — Mohammad Choudhry
(74) *Attorney, Agent, or Firm* — Harness, Dickey & Pierce, P.L.C.

(57) ABSTRACT

An image sensor package including a PCB including bonding areas, an image sensor including bonding pads on edge portions thereof on the PCB, bonding wires connecting the bonding pads with the bonding areas, an insulating adhesion film attaching the bonding wires to the bonding pads on the edge portions of the image sensor, a heat spread pattern spaced apart from the bonding wires and the image sensor on the insulating adhesion film, a supporting holder spaced apart from the edge portions of the image sensor, encloses the image sensor, contacts a top surface of the heat spread pattern and the PCB, and includes a supporting portion at an upper portion thereof, and a transparent cover covering the image sensor on the supporting portion of the supporting holder and spaced apart from the top surface of the image sensor is provided.

18 Claims, 10 Drawing Sheets

IMAGE SENSOR PACKAGE

CROSS-REFERENCE TO RELATED APPLICATION

This application claims priority under 35 USC §119 to Korean Patent Application No. 10-2012-0140800 filed on Dec. 6, 2012 in the Korean Intellectual Property Office (KIPO), the entire disclosure of which is incorporated herein by reference.

BACKGROUND

1. Field

Example embodiments of the inventive concepts relate to image sensor packages. More particularly, some example embodiments of the inventive concepts relate to image sensor packages that may be used for a photo device.

2. Description of the Related Art

An image sensor that may be used for various fields such as digital cameras, portable equipment, scanners, computers, cars, etc., may convert a received external light into an electric signal. According to the miniaturization of an optical instrument, the image sensor may be manufactured as a package type, which has a comparable size to a chip size of the optical instrument. The image sensor mounted on an image sensor package may be desired to have a high performance without deterioration of an image. In order to obtain a clear image using the image sensor, a structure of the image sensor package may be optimized.

SUMMARY

Example embodiments of the inventive concepts provide image sensor packages that may obtain a high quality image.

According to example embodiments, the image sensor package may include a printed circuit board (PCB), an image sensor, bonding wires, an insulating adhesion film, a heat spread pattern, a supporting holder, and a transparent cover covering the image sensor. The PCB may include bonding areas. The image sensor may be disposed on the printed circuit board and includes bonding pads on edge portions thereof. The bonding wires may connect the bonding pads with the bonding areas. The insulating adhesion film may be on the edge portions of the image sensor and attach the bonding wires to the bonding pads. The heat spread pattern may be on the insulating adhesion film and be spaced apart from the bonding wires and the image sensor. The supporting holder may enclose the image sensor and be spaced apart from the edge portions of the image sensor. The supporting holder may be configured to contact a top surface of the heat spread pattern and the PCB, and include a supporting portion at an upper portion thereof. The transparent cover may be on the supporting portion of the supporting holder and be spaced apart from the top surface of the image sensor.

In example embodiments, a gap between the image sensor and the transparent cover may be filled with an air.

In example embodiments, the heat spread pattern may include a metal.

In example embodiments, the heat spread pattern may include a metal alloy.

In example embodiments, the heat spread pattern may be disposed on at least one of the edge portions of the image sensor.

In example embodiments, the heat spread pattern may have a linear shape extending over two opposite edge portions of the image sensor.

In example embodiments, the image sensor may include an active pixel sensor (APS) region and an image signal processing (ISP) region including driving circuits. The APS region may be disposed at a central portion of the image sensor and the ISP region may be disposed at a peripheral portion of the image sensor to surround the APS region. The heat spread pattern may overlap the ISP region including the driving circuits.

In example embodiments, the supporting holder may include an insulating material, which dissipates heat from the heat spread pattern.

In example embodiments, the supporting holder may include plastic or ceramic.

In example embodiments, the bonding areas of the PCB may have a flat surface.

In example embodiments, the bonding areas of the PCB may be spaced apart from the edge portions of the image sensor.

In example embodiments, the insulating adhesion film may be disposed adjacent to a portion of the image sensor, from which relatively more heat is generated.

In example embodiments, the insulating adhesion film may be formed under the heat spread pattern.

In example embodiments, the heat spread pattern may be formed on a top surface of the insulating adhesion film.

In example embodiments, the image sensor may include a complementary metal oxide semiconductor (CMOS) image sensor.

According to example embodiments, an image sensor package may include a substrate including bonding areas, an image sensor on the substrate, the image sensor including bonding pads, the bonding pads electrically coupled to the bonding areas, a heat spreader pattern on a hot spot of the image sensor and configured to be electrically insulated from the image sensor and transfer heat, and a supporting holder thermally coupled to the heat spreader, surrounding the image sensor, and configured to receive a transparent cover.

In example embodiments, the image sensor package may further include an insulating adhesion film between the image sensor and the heat spread pattern, and the insulating adhesion film may be configured to electrically insulate the heat spread pattern from the image sensor.

In example embodiments, the image sensor may include active pixel sensor (APS) region and an imager signal processor (ISP) region and the hot spot may be the ISP region.

In example embodiments, the supporting holder may have a groove, on which edge portions of the transparent cover is to be mounted.

In example embodiments, the supporting holder may contact at least a portion of a top surface of the heat spread pattern.

As described above, the heat generated from the edge portions of the image sensor may be effectively emitted out of the image sensor package through the heat spread pattern 52 contacting the edge portions of the image sensor. Accordingly, a clear image may be obtained by using the image sensor package.

BRIEF DESCRIPTION OF THE DRAWINGS

Example embodiments will be more clearly understood from the following detailed description taken in conjunction with the accompanying drawings. FIGS. 1 to 10B represent non-limiting, example embodiments as described herein.

FIG. 1 is a cross-sectional view illustrating an image sensor package in accordance with example embodiments;

FIG. 2 is a plan view illustrating the image sensor package illustrated in FIG. 1;

FIG. 3 is a partially exploded perspective view illustrating the image sensor package illustrated in FIG. 1;

FIG. 4 is a plan view illustrating regions of an image sensor of the image sensor package in FIG. 1;

FIG. 5 is a plan view illustrating an image sensor package in accordance with example embodiments;

FIG. 6 is a plan view illustrating an image sensor package in accordance with example embodiments;

FIG. 7 is a plan view illustrating an image sensor package in accordance with example embodiments;

FIG. 8 is a partially exploded perspective view illustrating the image sensor package illustrated in FIG. 7;

FIG. 9 is a plan view illustrating an image sensor package in accordance with example embodiments;

FIG. 10B is a diagram showing the temperature distribution of the image sensor package in accordance with Example when operated.

DETAILED DESCRIPTION OF THE EMBODIMENTS

Figure 1:
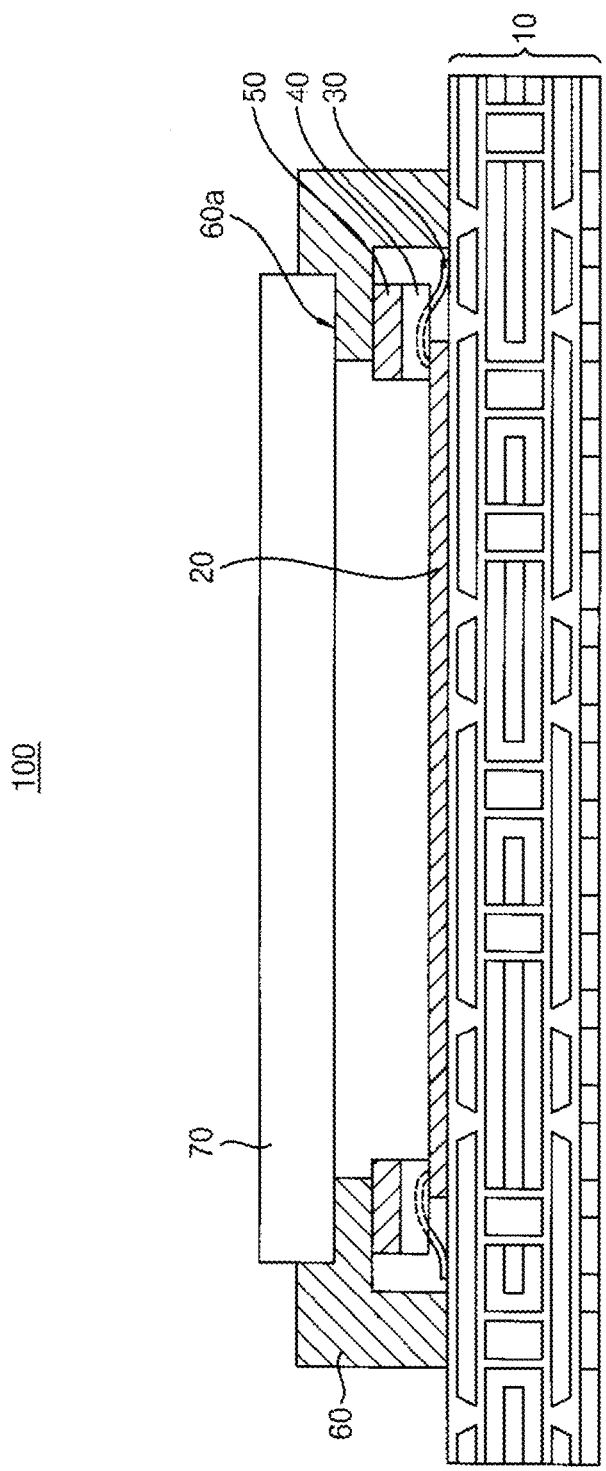

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
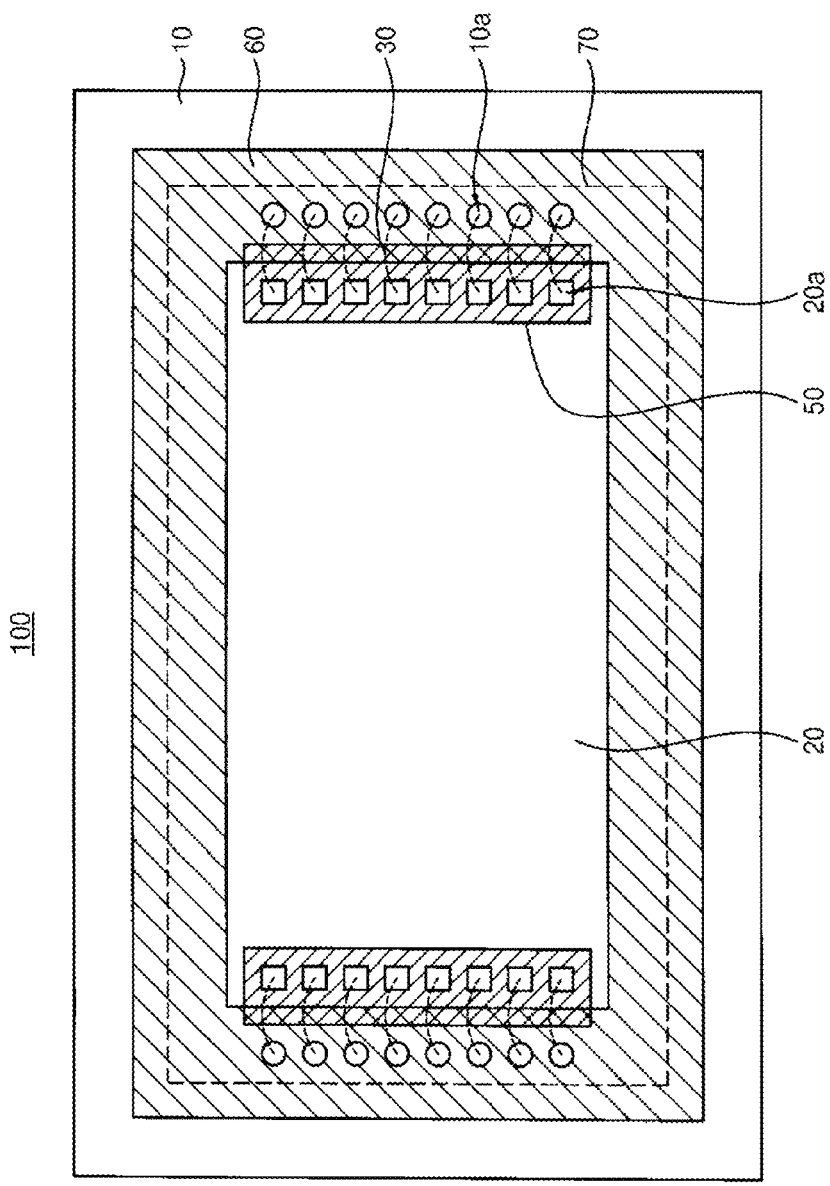
Figure 3:
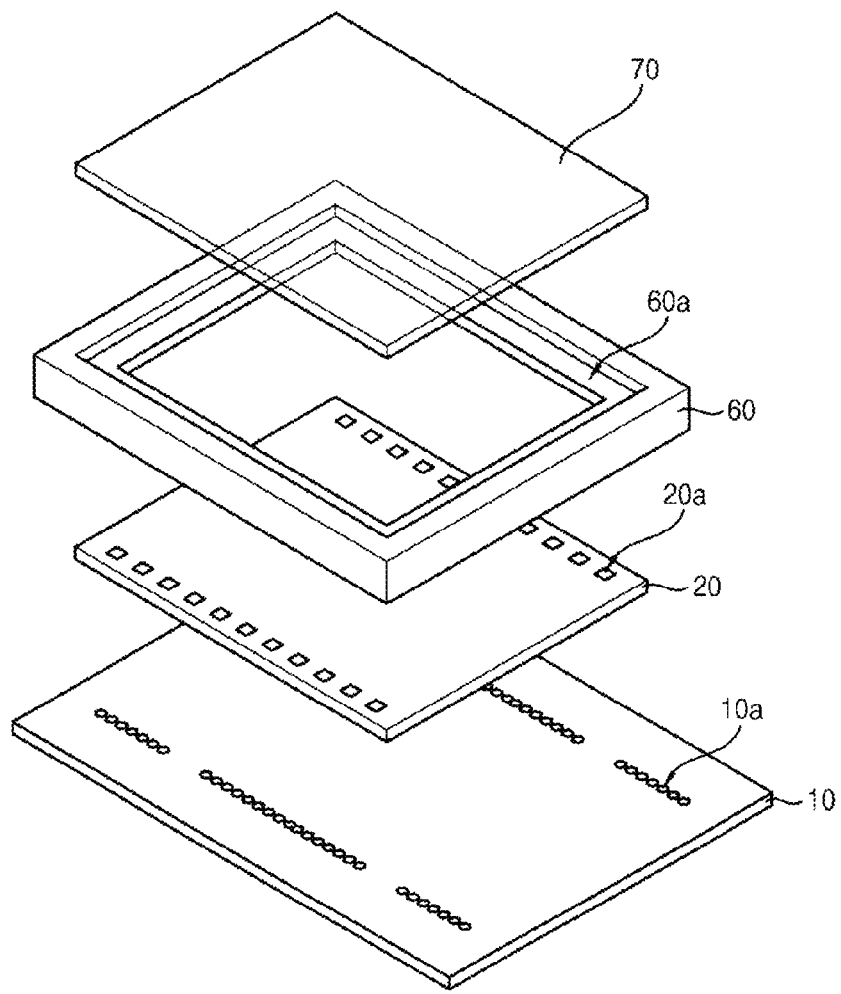
Figure 4:
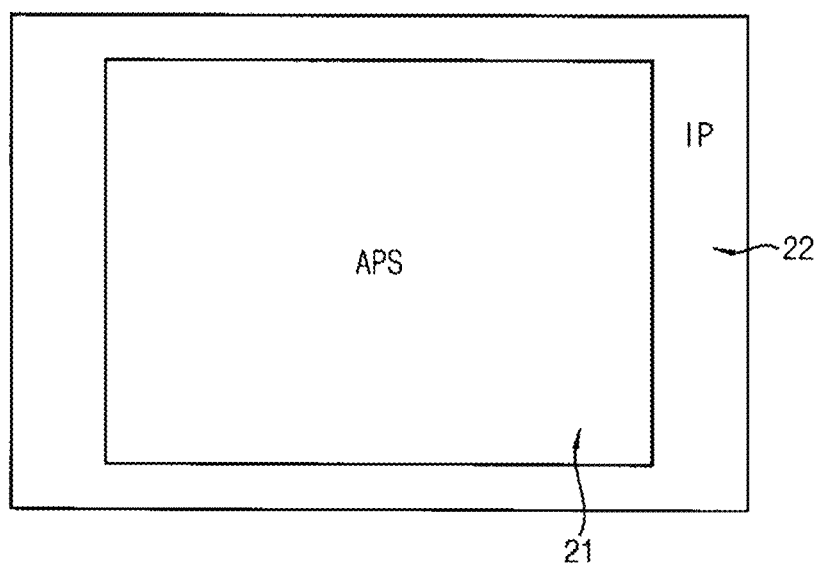

FIG. 1 is a cross-sectional view illustrating an image sensor package in accordance with example embodiments. FIG. 2 is a plan view illustrating the image sensor package illustrated in FIG. 1. FIG. 3 is a partially exploded perspective view illustrating the image sensor package illustrated in FIG. 1. FIG. 4 is a plan view illustrating regions of an image sensor of the image sensor package in FIG. 1. In FIG. 3, a bonding wire, an insulating adhesion film and a heat spread pattern are not shown for the convenience of simplicity.

Referring to FIGS. 1 to 4, an image sensor package 100 may include a printed circuit board (PCB) 10, an image sensor 20, bonding wires 30, an insulating adhesion film 40, a heat spread pattern 50, a supporting holder 60, and a transparent cover 70.

The image sensor package 100 may have the image sensor 20 mounted therein, and the image sensor 20 may be electrically connected to integrated circuits (ICs) (not shown) of the PCB 10 via the bonding wires 30. In example embodiments, the image sensor 20 may include a complementary metal oxide semiconductor (CMOS) image sensor. Alternatively, the image sensor 20 may include a charge coupled device (CCD) image sensor.

The PCB 10 may be an insulation substrate including wirings therein. The PCB 10 may include bonding areas 10a. The bonding areas 10a may be spaced apart from edge portions of the image sensor 20 and may not directly contact the image sensor 20.

In an example embodiment, the bonding areas 10a of the PCB 10 may be spaced apart from two opposite edge portions of the image sensor 20, which may be referred to as first opposite edge portions of the image sensor 20. Alternatively, the bonding areas 10a of the PCB 10 may surround all edge portions of the image sensor 20, e.g., the first opposite edge portions and second opposite edge portions including the other opposite edge portions of the image sensor 20.

The bonding areas 10a may not protrude from a top surface of the PCB 10. In an example embodiment, the bonding areas 10a may be holes having a conductive material layer (not shown) on an inner wall thereof. The conductive material layer may be an electroplating window including a low resistance metal, e.g., gold or silver. In an example embodiment, the bonding areas 10a of the PCB 10 may not include conductive balls. The PCB 10 may have the ICs mounted thereon in a land grid array (LGA) type.

The image sensor 20 may be disposed on the PCB 10. The image sensor 20 may include bonding pads 20a on edge portions of the image sensor 20. The bonding pads 20a may be disposed along at least one of the edge portions of the image sensor 20. In an example embodiment, the bonding pads 20a may be disposed along the first opposite edge portions of the image sensor 20 adjacent to the bonding areas 10a of the PCB 10.

The image sensor 20 may include an active pixel sensor (APS) region 21 and an image signal processing (ISP) region 22. The APS region 21 may include active pixels (not shown) arranged in an array, and the ISP region 22 may include driving circuits (not shown) for driving the active pixels. The APS region 21 may be disposed at a central portion of the image sensor 20, and the ISP region 22 may be disposed at a peripheral portion of the image sensor 20, which may surround the APS region 21. The bonding pads 20a may be disposed in the ISP region 22.

When the image sensor 20 is operated, electrical signals may be input or output into or from the driving circuits of the ISP region 22 consuming a large amount of power, and thus the ISP region 22 may be heated by the power consumption. Accordingly, a temperature of the ISP region 22 may be higher than a temperature of the APS region 21, which may cause temperature distribution imbalance between the APS region 21 and the ISP region 22 in the image sensor 20, and thus deteriorating image of the image sensor 20. For example, a color of the image obtained from a hot spot, which means a portion having a relatively high temperature in the image sensor 20, may be discolored, for example, yellow.

The bonding wires 30 may connect the bonding pads 20a of the image sensor 20 to the bonding areas 10a of the PCB 10. The bonding wires 30 may include a metal having a low resistance. For example, the bonding wires 30 may include gold or silver.

When the bonding pads 20a are disposed on the first opposite edge portions of the image sensor 20, the bonding wires 30 may be formed adjacent to the first opposite edge portions of the image sensor 20, and may not be formed adjacent to the second opposite edge portions of the image sensor 20.

The insulating adhesion film 40 may be disposed on the first opposite edge portions of the image sensor 20. The insulating adhesion film 40 may attach the bonding wires 30 to the bonding pads 20a. The insulating adhesion film 40 may be interposed between the image sensor 20 and the heat spread pattern 50 so that the image sensor 20 may not directly contact the heat spread pattern 50. Thus, the insulating adhesion film 40 may be formed adjacent to the bonding wires 30. In addition, regardless of the position of the bonding wires 30, the insulating adhesion film 40 may be formed beneath the heat spread pattern 50. The heat spread pattern 50 may be formed to overlap the hot spot of the image sensor 20, which may be disposed, for example, in the ISP region 22 of the image sensor 20.

In example embodiments, the insulating adhesion film 40 may have a linear shape extending over the first opposite edge portions of the image sensor 20 on which the bonding pads 20a are formed. Thus, two linear shaped insulating adhesion film 40 may be formed. However, the shape and position of the insulating adhesion film 40 are not limited thereto, and various modifications may be possible, as illustrated later.

The insulating adhesion film 40 may include epoxy resin. However, the material of the insulating adhesion film may not be limited thereto, and other materials that can attach the bonding wires 30 to the PCB 10 may be used.

The heat spread pattern 50 may be formed directly on a top surface of the insulating adhesion film 40, and may be electrically insulated from both of the image sensor 20 and the bonding wires 30. The heat spread pattern 50 may transfer heat from the hot spot to the supporting holder 60 so that the heat from the image sensor 120 may be spread and/or dissipated. In example embodiments, the heat spread pattern 50 may include a material having a high thermal conductivity, e.g., a metal or a metal alloy. In an example embodiment, the heat spread pattern 50 may include a metallic tape.

The heat spread pattern 50 may be formed on a whole upper surface of the insulating adhesion film 40. Alternatively, the heat spread pattern 50 may be formed on a portion of the upper surface of the insulating adhesion film 40.

The heat spread pattern 50 may overlap the hot spot of the image sensor 20. For example, the heat spread pattern 50 may overlap a least a portion of the ISP region 22 of the image sensor 20. In example embodiments, the heat spread pattern 50 may overlap the first opposite edge portions of the image sensor 20 and may be spaced apart from the image sensor, for instance, in a vertical direction. In an example embodiment, the heat spread pattern 50 may have a liner shape extending over the first opposite edge portions of the image sensor 20. The shape and position of the heat spread pattern 50 are not limited thereto, but other modifications may be possible.

A temperature of the bonding wires 30 through which the electrical signals is transferred may be relatively high, and thus the heat spread pattern 50 may be formed adjacent to the bonding wires 30.

The supporting holder 60 may surround the image sensor 20, but may be spaced apart from the edge portions of the image sensor 20. The supporting holder 60 may contact a top surface of the heat spread pattern 50 and the PCB 10. The supporting holder 60 may protrude from the PCB 10, and an upper portion of the supporting holder 60 may be bent toward the heat spread pattern 50.

The supporting holder 60 may include a supporting portion 60a for receiving the transparent cover 70 at an upper portion thereof. In example embodiments, the supporting portion 60a may be a groove on which edge portions of the transparent cover 70 may be mounted. In other words, a bottom and a sidewall of each edge portion of the transparent cover 70 may contact the supporting portion 60a.

The supporting holder 60 may contact the top surface of the heat spread pattern 50, and may emit the heat from the heat spread pattern 50. The supporting holder 60 may include an insulating material that may dissipate the heat from the heat spread pattern 50. Examples of the insulating material may include plastic, ceramic, etc., however, the insulating material may not be limited thereto.

In addition, the transparent cover 70 and the image sensor 20 may be spaced apart from the each other by the supporting holder 60. In other words, a gap may be formed between the transparent cover 70 and the image sensor 20 by the supporting holder 60. A distance between the transparent cover 70 and the image sensor 20 and a volume of the gap may be varied in accordance with a height of the supporting holder 60 and/or a depth of the supporting portion 60a, e.g., a depth of the groove.

The transparent cover 70 may be a flat plate. The edge portions of the transport cover 70 may be mounted on the supporting portion 60a of the supporting holder 60. The transparent cover 70 may be spaced apart from atop surface of the image sensor 20 and cover the image sensor 20. Therefore, the image sensor 20 may be packed by the transparent cover 70 and the supporting holder 60.

The transparent cover 70 may include a material having a high light transmission, e.g., glass. The transparent cover 70 may prevent foreign object from being attached to the image sensor 20.

The gap between the transparent cover 70 and the image sensor 20 may not be filled with a material having a low light transmission, e.g., epoxy, but filled with an air.

The air has a low thermal conductivity, and thus the heat from the image sensor 20 may not be effectively emitted out of the image sensor package 100.

The image sensor package 100 in accordance with example embodiments may include the heat spread pattern 50 overlapping the first opposite edge portions of the image sensor 20 from which heat may be generated. Thus the heat may not stay in the gap, but may be emitted out of the image sensor package 100 through the heat spread pattern 50 and the supporting holder 60.

Accordingly, a temperature in the gap on the image sensor 20 may be maintained relatively uniform during the operation of the image sensor 20 due to the enhanced emission of the heat. Thus, in accordance with example embodiments, the deterioration of images caused by the non-uniformity of the temperature distribution may be prevented or minimized. Thus, a clear image may be obtained by using the image sensor package 100.

Figure 5:
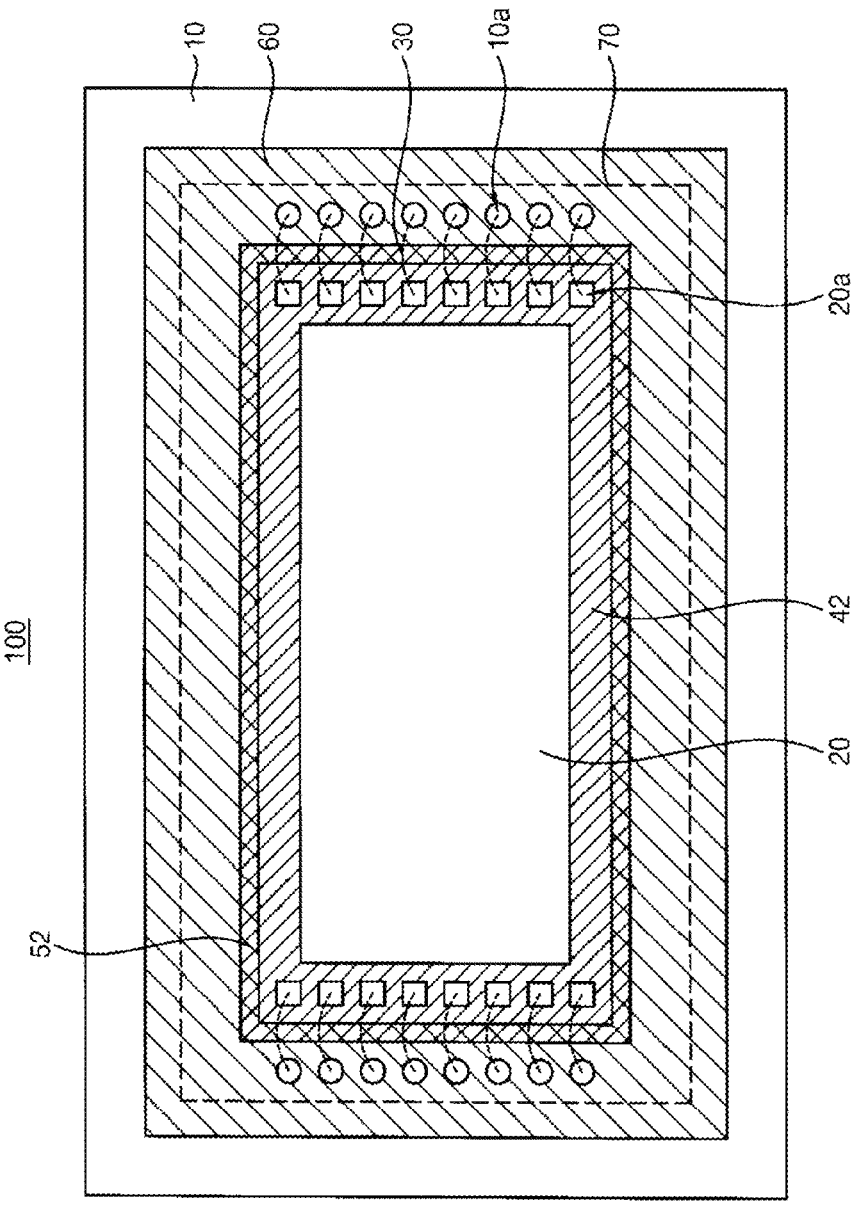

FIG. 5 is a plan view illustrating an image sensor package in accordance with example embodiments. The image sensor package in accordance with these example embodiments may have a cross-sectional view substantially the same as FIG. 1.

Referring to the FIG. 5, the image sensor package 100 may include a PCB 10, an image sensor 20, bonding wires 30, an insulating adhesion film 42, a heat spread pattern 52, a supporting holder 60, and a transparent cover 70.

The PCB 10, the image sensor 20, the bonding wires 30, the supporting holder 60, and the transparent cover 70 may be substantially the same as those illustrated in FIG. 1, respectively. Thus, the bonding pads 20a may be disposed on the first opposite edge portions of the image sensor 20, and the bonding wires 30 may be disposed adjacent to the first opposite edge portions of the image sensor 20.

The insulating adhesion film 42 may be disposed adjacent to the bonding wires 30. In addition, the insulating adhesion film 42 may be formed beneath the heat spread pattern 52, regardless of the position of the bonding wires 30.

The insulating adhesion film 42 may surround the edge portions of the image sensor 20, and thus may have a square ring shape when viewed from a top side. For example, the insulating adhesion film 42 may have four linear bars each of which may extend over the four edge portions of the image sensor 20, e.g., the first and second opposite edge portions thereof. The four linear bars may be connected to each other.

The heat spread pattern 52 may directly contact a whole top surface of the insulating adhesion film 42, and may have a shape substantially the same as that of the insulating adhesion film 42 when viewed from a top side. For example, the heat spread pattern 52 may surround the edge portions of the image sensor 20, and thus may have a square ring shape when viewed from a top side.

The supporting holder 60 may contact the heat spread pattern 52, and dissipate heat therefrom.

As described above, the heat generated from the edge portions of the image sensor 20 may be effectively emitted out of the image sensor package 100 through the heat spread pattern 52 enclosing the edge portions of the image sensor 20.

Figure 6:
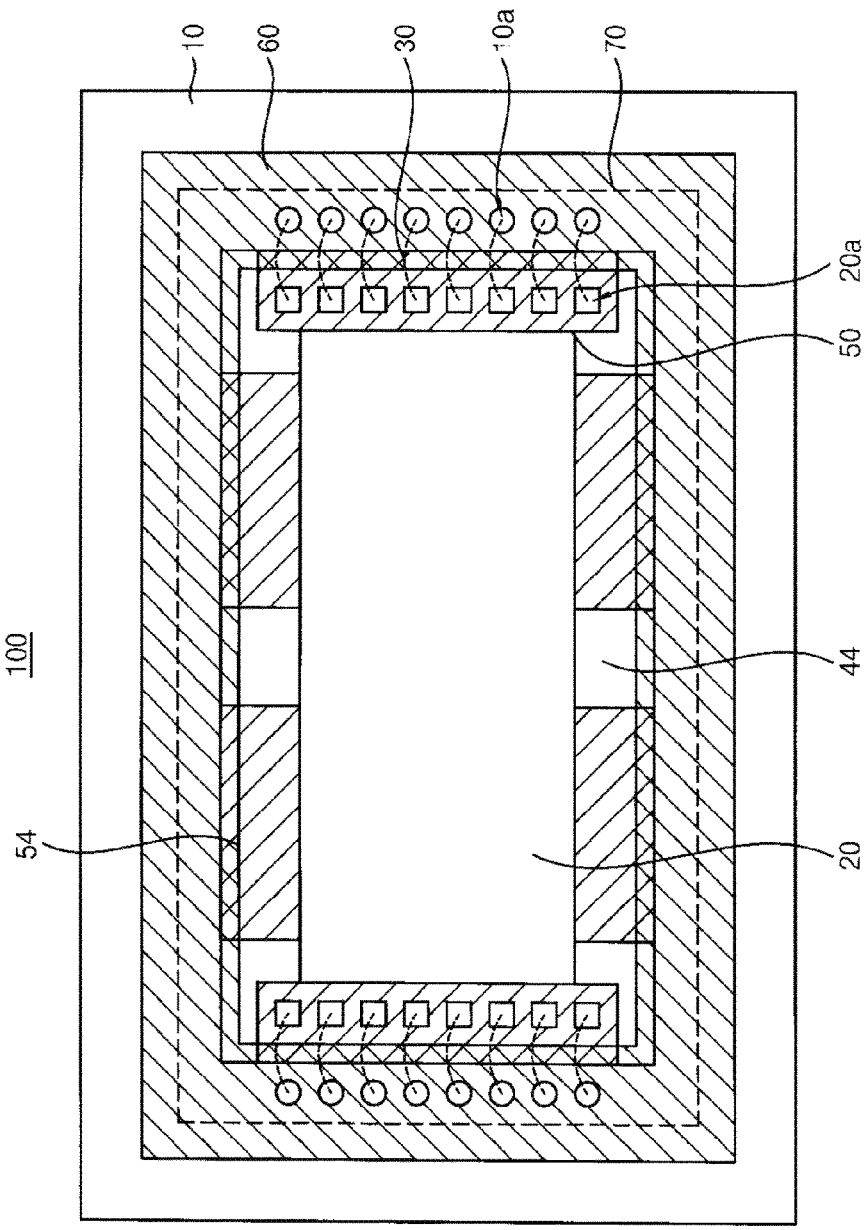

FIG. 6 is a plan view illustrating an image sensor package in accordance with example embodiments.

Referring to the FIG. 6, the image sensor package 100 may include a PCB 10, an image sensor 20, bonding wires 30, an insulating adhesion film 44, a heat spread pattern 54, a supporting holder 60, and a transparent cover 70.

The PCB 10, the image sensor 20, the bonding wires 30, the supporting holder 60, and the transparent cover 70 may be substantially the same as those illustrated in FIG. 5, respectively.

The insulating adhesion film 44 may be disposed adjacent to the bonding wires 30. In addition, the insulating adhesion film 44 may be formed beneath the heat spread pattern 52, regardless of the position of the bonding wires 30.

The insulating adhesion film 44 may surround the edge portions of the image sensor 20, and thus may have a square ring shape when viewed from a top side. For example, the insulating adhesion film 44 may have four linear bars each of which may extend over the four edge portions of the image sensor 20, e.g., the first and second opposite edge portions thereof. The four linear bars may be connected to each other.

The heat spread pattern 54 may directly contact a top surface of the insulating adhesion film 44, however, does not contact the whole top surface of the insulating adhesion film 44. For example, the heat spread pattern 54 may partially contact the top surface of the insulating adhesion film 44. The heat spread pattern 54 may have several pieces of linear bars, each of which may extend over the edge portions of the image sensor 20.

The supporting holder 60 may contact the heat spread pattern 54, and dissipate heat therefrom.

As described above, the heat generated from the edge portions of the image sensor 20 may be effectively emitted out of the image sensor package 100 through the heat spread pattern 54 contacting the edge portions of the image sensor 20.

Figure 7:
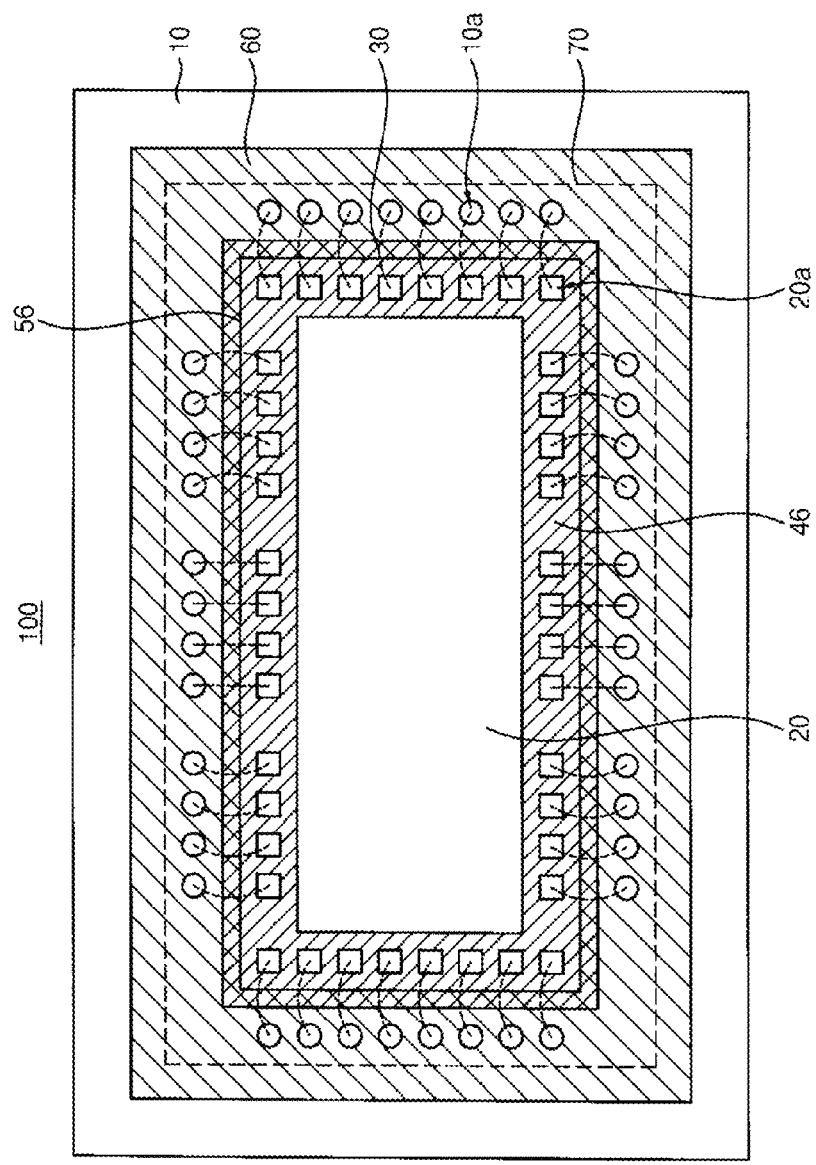
Figure 8:
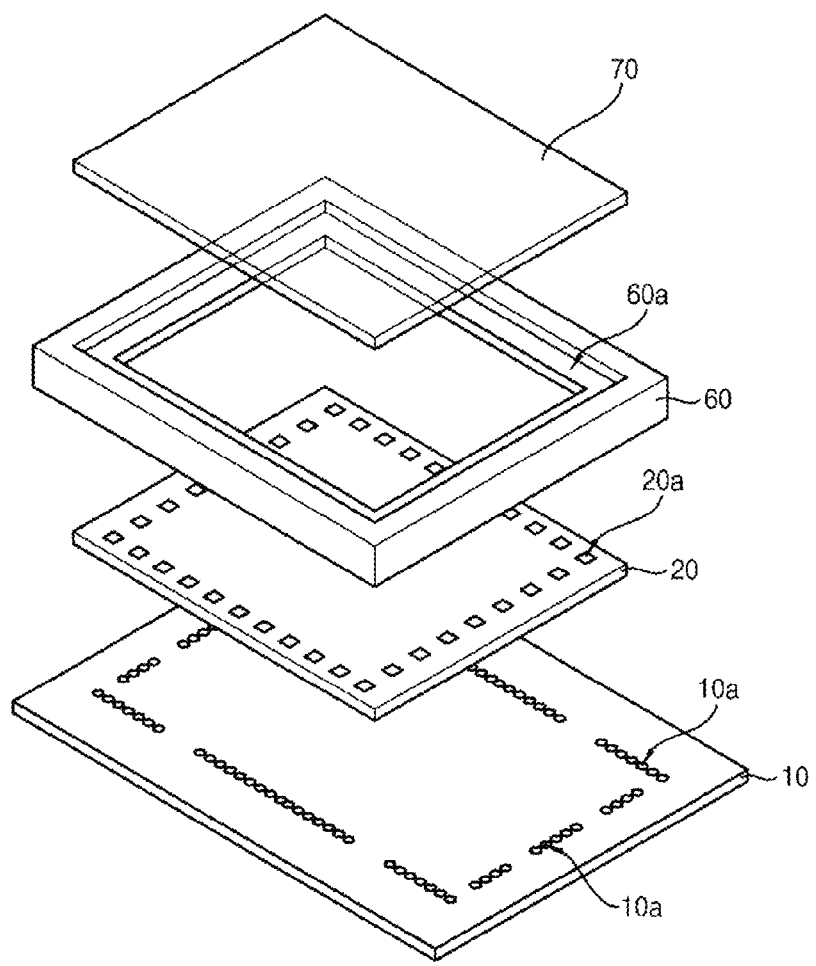

FIG. 7 is a plan view illustrating an image sensor package in accordance with example embodiments. FIG. 8 is a partially exploded perspective view illustrating the image sensor package illustrated in FIG. 7.

The bonding pads 20a of the image sensor package illustrated in FIGS. 7 and 8 may be arranged differently from that illustrated in FIGS. 1 to 3. The position of the bonding wires 30 may be varied according to the arrangement of the bonding pads 20a.

Referring to the FIGS. 7 and 8, the image sensor package 100 may include a PCB 10, an image sensor 20, bonding wires 30, an insulating adhesion film 46, a heat spread pattern 56, a supporting holder 60, and a transparent cover 70.

The PCB 10 may include bonding areas 10a. The bonding areas 10a may surround all edge portions of the image sensor 20, e.g., the first and second opposite edge portions of the image sensor 20.

The image sensor 20 may be disposed on the PCB 10. The image sensor 20 may include bonding pads 20a on the edge portions of the image sensor 20. In an example embodiment, the bonding pads 20a may be disposed along the first and second opposite edge portions of the image sensor 20 adjacent to the bonding areas 10a of the PCB 10.

The bonding wires 30 may connect the bonding pads 20a of the image sensor 20 to the bonding areas 10a of the PCB 10. Therefore, the bonding wires 30 may be formed adjacent to the first and second opposite edge portions of the image sensor 20.

The insulating adhesion film 46 may be disposed adjacent to the bonding wires 30. The insulating adhesion film 46 may surround the edge portions of the image sensor 20, and thus may have a square ring shape when viewed from a top side. For example, the insulating adhesion film 46 may have four linear bars each of which may extend over the four edge portions of the image sensor 20, e.g., the first and second opposite edge portions thereof. The four linear bars may be connected to each other.

The heat spread pattern 56 may directly contact a whole top surface of the insulating adhesion film 46, and may have a shape substantially the same as that of the insulating adhesion film 46 when viewed from a top side. For example, the heat spread pattern 56 may surround the edge portions of the image sensor 20, and thus may have a square ring shape when viewed from a top side.

The supporting holder 60 may contact the heat spread pattern 56, and dissipate heat therefrom.

As described above, the heat generated from the edge portions of the image sensor 20 may be effectively emitted out of the image sensor package 100 through the heat spread pattern 56 contacting the edge portions of the image sensor 20.

Figure 9:
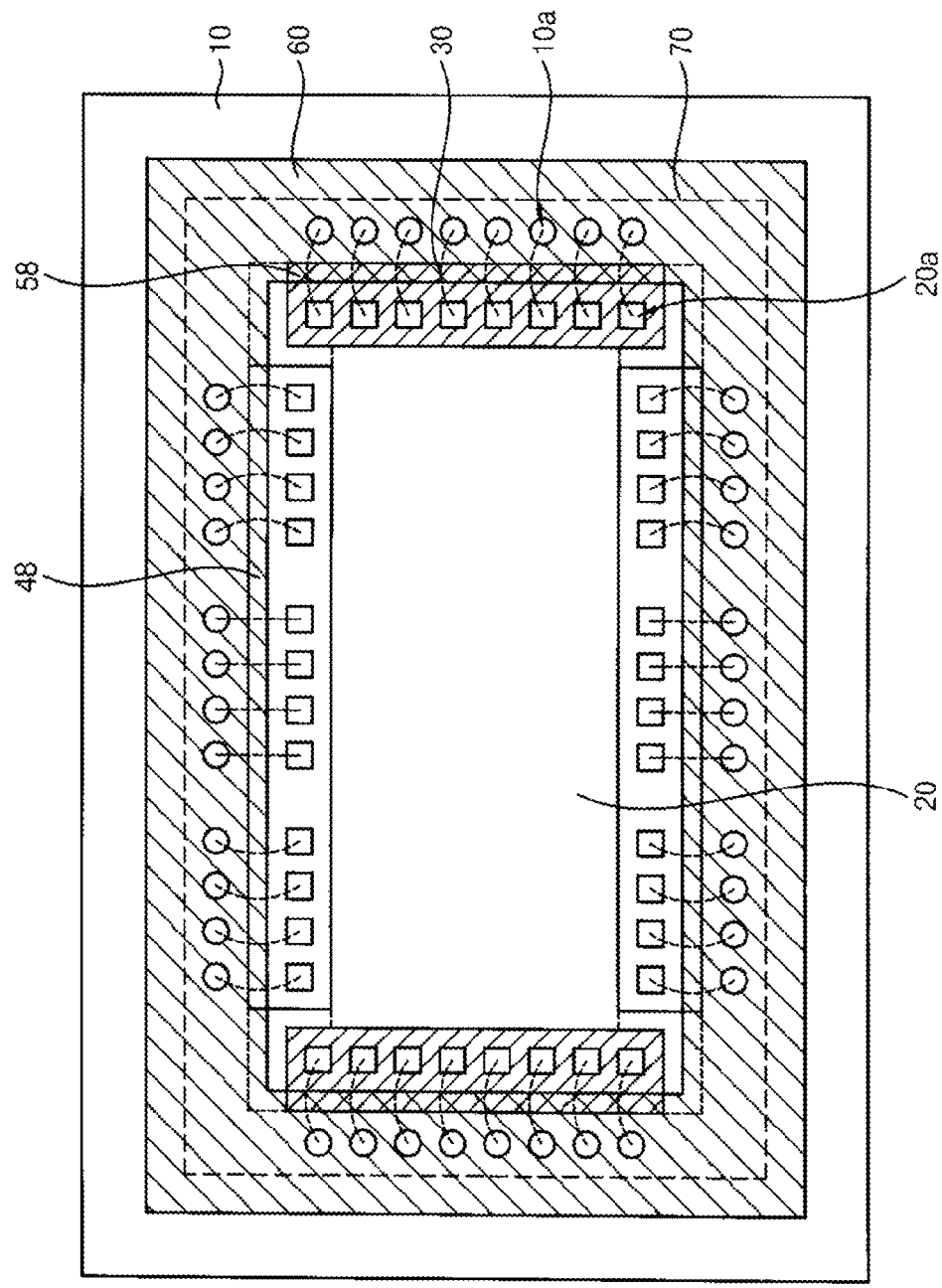

FIG. 9 is a plan view illustrating an image sensor package in accordance with example embodiments.

Referring to the FIG. 9, the image sensor package 100 may include a PCB 10, an image sensor 20, bonding wires 30, an insulating adhesion film 48, a heat spread pattern 58, a supporting holder 60, and a transparent cover 70. The PCB 10, the image sensor 20, the bonding wires 30, the insulating adhesion film 48, the supporting holder 60, and the transparent cover 70 may be substantially the same as those illustrated in FIG. 7, respectively.

The heat spread pattern 58 may directly contact a top surface of the insulating adhesion film 48, however, does not contact the whole top surface of the insulating adhesion film 48. For example, the heat spread pattern 58 may partially contact the top surface of the insulating adhesion film 48. The heat spread pattern 58 may overlap at least a portion of the bonding wires 30. Thus, the heat spread pattern 58 may have several pieces of linear bars, each of which may extend over the edge portions of the image sensor 20 and overlap the bonding wires 30.

The supporting holder 60 may contact the heat spread pattern 58, and dissipate heat therefrom.

As described above, the heat generated from the edge portions of the image sensor 20 may be effectively emitted out of the image sensor package 100 through the heat spread pattern 58 contacting the edge portions of the image sensor 20.

Experiment on Temperature Distribution

Temperatures of image sensor packages in accordance with Example and Comparative Example were measured.

The image sensor package in accordance with Example had the structure illustrated in FIG. 1 to 3, and the image sensor package in accordance with Comparative Example had a structure including a PCB, an image sensor, bonding wires, an insulating adhesion film, a supporting holder and a transparent cover.

Figure 10A:
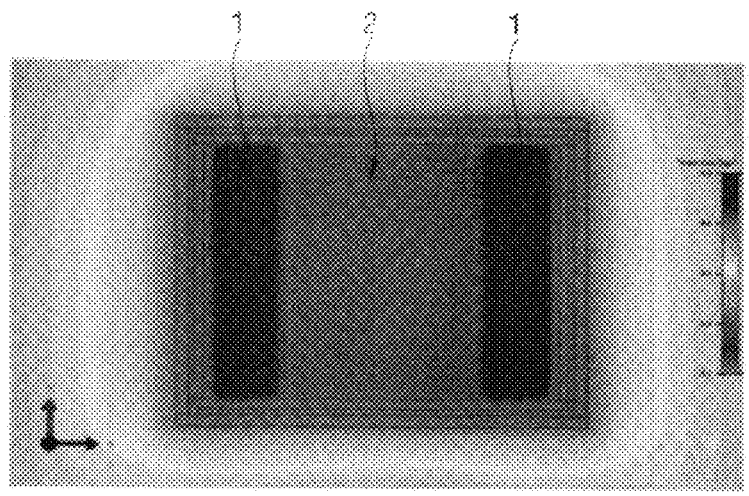
FIG. 10A is a diagram showing the temperature distribution of the image sensor package in accordance with Comparative Example when operated.
Figure 10B:
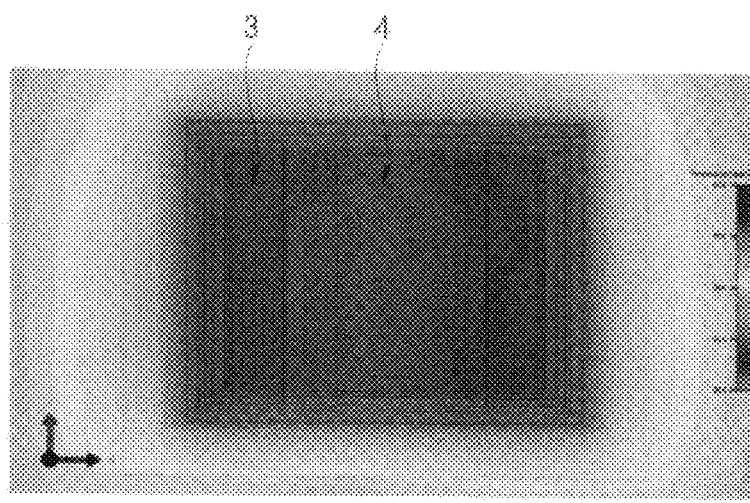

FIG. 10A is a diagram showing the temperature distribution of the image sensor package in accordance with Comparative Example when operated. FIG. 10B is a diagram showing the temperature distribution of the image sensor package in accordance with Example when operated.

Referring to the FIG. 10A, the edge portions of the image sensor corresponding to the ISP region shows a temperature higher than that of the central portions of the image sensor, e.g., the APS region. The temperature difference between these two regions is very big.

Referring to the FIG. 10B, a temperature of the ISP region of the image sensor is lower than that of the ISP region of the image sensor in Comparative Example. Additionally, the temperature difference between the ISP region and the APS region is relatively small.

As described above, the heat generated from the edge portions of the image sensor in accordance with Example may be effectively emitted, and thus good quality images may be obtained.

The image sensor package in accordance with example embodiments of the present inventive concepts may be applied to various devices, e.g., digital cameras, portable devices, scanners, computers, automobiles, etc.

What is claimed is:

1. An image sensor package, comprising:
   a printed circuit board (PCB) including bonding areas;
   an image sensor on the PCB, the image sensor including bonding pads on edge portions thereof;
   bonding wires configured to connect the bonding pads with the bonding areas;
   an insulating adhesion film on the edge portions of the image sensor, the insulating adhesion film configured to attach the bonding wires to the bonding pads;
   a heat spread pattern on the insulating adhesion film, the heat spread pattern spaced apart from the bonding wires and the image sensor;
   a supporting holder configured to enclose the image sensor and spaced apart from the edge portions of the image sensor, the supporting holder configured to contact a top surface of the heat spread pattern and the PCB, and the supporting holder including a supporting portion at an upper portion thereof; and
   a transparent cover configured to cover the image sensor, the transparent cover on the supporting portion of the supporting holder and spaced apart from a top surface of the image sensor, wherein
   the image sensor includes an active pixel sensor (APS) region and an image signal processing (ISP) region including driving circuits, the APS region disposed at a central portion of the image sensor and the ISP region disposed at a peripheral portion of the image sensor to surround the APS region, and
   the heat spread pattern overlaps the ISP region including the driving circuits.

2. The image sensor package of claim 1, wherein a gap between the image sensor and the transparent cover is filled with an air.

3. The image sensor package of claim 1, wherein the heat spread pattern includes a metal.

4. The image sensor package of claim 1, wherein the heat spread pattern includes a metal alloy.

5. The image sensor package of claim 1, wherein the heat spread pattern is disposed on at least one of the edge portions of the image sensor.

6. The image sensor package of claim 5, wherein the heat spread pattern has a linear shape extending over two opposite edge portions of the image sensor.

7. The image sensor package of claim 1, wherein the supporting holder includes an insulating material, which dissipates heat from the heat spread pattern.

8. The image sensor package of claim 7, wherein the supporting holder includes plastic or ceramic.

9. The image sensor package of claim 1, wherein the bonding areas of the PCB have a flat surface.

10. The image sensor package of claim 1, wherein the bonding areas of the PCB is spaced apart from the edge portions of the image sensor.

11. The image sensor package of claim 1, wherein the insulating adhesion film is disposed adjacent to a portion of the image sensor, from which relatively more heat is generated.

12. The image sensor package of claim 1, wherein the insulating adhesion film is under the heat spread pattern.

13. The image sensor package of claim 1, wherein the heat spread pattern is on a top surface of the insulating adhesion film.

14. The image sensor package of claim 1, wherein the image sensor includes a complementary metal oxide semiconductor (CMOS) image sensor.

15. An image sensor package, comprising:
- a substrate including bonding areas;
- an image sensor on the substrate, the image sensor including bonding pads, the bonding pads electrically coupled to the bonding areas;
- a heat spreader pattern on a hot spot of the image sensor, the heat spreader pattern configured to be electrically insulated from the image sensor and transfer heat; and
- a supporting holder thermally coupled to the heat spreader, the supporting holder surrounding the image sensor and configured to receive a transparent cover, wherein the image sensor includes an active pixel sensor (APS) region and an image signal processing (ISP) region including driving circuits, the APS region disposed at a central portion of the image sensor and the ISP region disposed at a peripheral portion of the image sensor to surround the APS region, and
- the heat spread pattern overlaps the ISP region including the driving circuits.

16. The image sensor package of claim 15, further comprising:
- an insulating adhesion film between the image sensor and the heat spread pattern, the insulating adhesion film configured to electrically insulate the heat spread pattern from the image sensor.

17. The image sensor package of claim 15, wherein the supporting holder has a groove, on which edge portions of the transparent cover is to be mounted.

18. The image sensor package of claim 15, wherein the supporting holder contacts at least a portion of a top surface of the heat spread pattern.

* * * * *